United States Patent [19]
Hsu et al.

[11] Patent Number: 5,530,418
[45] Date of Patent: Jun. 25, 1996

[54] METHOD FOR SHIELDING POLYSILICON RESISTORS FROM HYDROGEN INTRUSION

[75] Inventors: Shun-Liang Hsu; Han-Liang Tseng; Mou-Shiung Lin, all of Hsin-chu, Taiwan

[73] Assignee: Taiwan Semiconductor Manufacturing Company, Hsinchu, Taiwan

[21] Appl. No.: 507,535

[22] Filed: Jul. 26, 1995

[51] Int. Cl.$^6$ ................................................ H01C 1/012
[52] U.S. Cl. ..................... 338/307; 338/308; 338/254; 338/314; 437/10; 437/918
[58] Field of Search ........................ 338/306–309, 338/254, 314; 437/10, 918

[56] References Cited

U.S. PATENT DOCUMENTS

| | | | |
|---|---|---|---|
| 4,446,613 | 5/1984 | Beinglass et al. | 29/571 |
| 4,658,378 | 4/1987 | Bourassa | 365/154 |
| 5,108,945 | 4/1992 | Matthews | 437/60 |
| 5,200,733 | 4/1993 | Davis et al. | 338/307 |
| 5,273,924 | 12/1993 | Chan et al. | 437/918 |
| 5,443,661 | 8/1995 | Oguro et al. | 437/10 |
| 5,478,758 | 12/1995 | Easter | 437/10 |

FOREIGN PATENT DOCUMENTS

| | | |
|---|---|---|
| 04064217A | 2/1992 | Japan . |
| 3-259960 | 5/1993 | Japan . |
| 9304296B | 5/1993 | Rep. of Korea . |

OTHER PUBLICATIONS

IBM Technical Disclosure, Polysilicon Resistor Process, Leas et al., vol. 24, No. 1a, Jun. 1981.
Nakabayashi et al, "Influence of Hydrogen on Electrical Characteristics of Poly–Si Resistor" 32 Japan of Applied Physics, Pt. 1, No. 9A, 3734 (1993).

*Primary Examiner*—Teresa J. Walberg
*Assistant Examiner*—Karl Easthom
*Attorney, Agent, or Firm*—George O. Saile; Alek P. Szecsy

[57] ABSTRACT

A polysilicon resistor structure and a method by which the polysilicon resistor structure may be formed. A polysilicon resistor is formed upon the surface of a semiconductor substrate. A pair of dummy polysilicon layers is formed along opposite edges and separated from the polysilicon resistor. A pair of metal sidewalls is then formed upon the upper surfaces of the pair of dummy polysilicon layers, and a top metal layer is formed bridging the upper surfaces of the pair of metal sidewalls. The pair of dummy polysilicon layers, the pair of metal sidewalls and the top metal layer form an open ended cavity upon the semiconductor substrate within which structure the polysilicon resistor resides. The polysilicon resistor is separated from the structure by an insulating material which is not susceptible to outgassing of hydrogen.

22 Claims, 3 Drawing Sheets

METHOD FOR SHIELDING POLYSILICON RESISTORS FROM HYDROGEN INTRUSION

BACKGROUND OF THE INVENTION

1. Field of the Invention

The present invention relates generally to resistors formed within and upon semiconductor integrated circuit substrates. More particularly, the present invention relates to a method whereby a polysilicon resistor formed within a semiconductor integrated circuit may be shielded from intrusion of hydrogen from sources internal or external to the integrated circuit.

2. Description of Related Art

In addition to the use of transistors and diodes as switching elements and current rectifying devices in semiconductor integrated circuits, it is also quite common in the art that those circuits will have resistors incorporated into their designs and fabrications. Commonly, a resistor within an integrated circuit will provide an electrical load which assures proper operation of the circuit under the electrical current and voltage parameters to which the circuit was designed.

There are several methods and materials through which resistors may be designed and fabricated into semiconductor integrated circuits. A common traditional method is to fabricate resistors within the silicon semiconductor substrate of an integrated circuit. Resistors of varying resistance can easily be fabricated within such semiconductor substrates by means of doping the semiconductor substrate through an ion implantation process similar to the ion implantation process used in forming other active semiconductor regions within the same semiconductor substrate. The practice of forming resistors through implanting dopant ions into semiconductor substrates is a viable technique unless resistors are required whose resistance exceeds the resistance of the semiconductor substrate within which the resistor is desired to be fabricated.

An alternate process which provides resistors of greater or equal resistance to resistors formed within semiconductor substrates is to form resistors from discrete portions of a highly resistive material formed upon the surface of a semiconductor substrate. A common high resistivity material which is useful in forming these higher resistance resistors is undoped or lightly doped polysilicon. While it is known in the art that doped polysilicon is an excellent conductor from which conductive structures within integrated circuit devices may be fabricated, it is also well known that undoped or lightly doped polysilicon is a highly resistive material.

An unfortunate characteristic of polysilicon resistors formed within integrated circuits is their ability to absorb hydrogen to which those resistors are exposed during semiconductor processing operations. This characteristic is well documented in the art. For example, Nakabayashi et al., in "Influence of Hydrogen on Electrical Characteristics of Poly-Si Resistor," 32 Jpn. J. Appl. Phys., Pt. 1, No. 9A, 3734 (1993), discusses the extent to which hydrogen may be absorbed into polysilicon resistors during hydrogen annealing operations to which those resistors are exposed. The disclosure also discusses the mechanism by which absorbed hydrogen affects the resistance of a polysilicon resistor.

In general, the disclosure indicates that hydrogen to which polysilicon resistors are exposed during integrated circuit processing is absorbed at trap locations within polysilicon grain boundaries of those resistors. Upon stabilization of the trap locations through absorption of hydrogen, the resistance of a polysilicon resistor may change substantially. In particular, Nakabayashi discloses that polysilicon resistors formed within semiconductor integrated circuits which integrated circuits have silicon nitride passivating layers upon their surfaces are particularly susceptible to substantial changes in resistivity upon subsequent annealing of the integrated circuits in a hydrogen atmosphere. Disclosed are decreases in polysilicon resistor resistance of up to 30%.

Also disclosed are methods by which some portion of the resistance decreases within those polysilicon resistors may be recovered. In particular, fabrication of a metal plate which covers a substantial portion of the polysilicon resistor surface and is immediately separated from the polysilicon resistor surface by a silicon oxide insulating layer may recover about one third of the 30% resistance decrease. An additional 10% of the resistance decrease may be recovered through forming the polysilicon resistor upon a thin oxide coating upon the semiconductor substrate upon which the polysilicon resistor is formed rather than forming the polysilicon resistor upon a thick field oxide coating upon the semiconductor substrate.

Not disclosed within the art are methods and materials which more completely stabilize polysilicon resistors against resistance losses due to hydrogen intrusion. Such methods and materials would be particularly useful for stabilizing polysilicon resistors which are formed within integrated circuits having silicon nitride passivation layers upon their surfaces when those integrated circuits are annealed in hydrogen atmospheres.

SUMMARY OF THE INVENTION

A first object of the present invention is to provide a polysilicon resistor structure within a semiconductor integrated circuit, which polysilicon resistor structure stabilizes a polysilicon resistor formed within that polysilicon resistor structure against resistance changes due to absorption of hydrogen.

A second object of the present invention is to provide a polysilicon resistor structure in accord with the first object of the present invention, which polysilicon resistor structure is readily manufacturable.

In accord with the objects of the present invention, a new polysilicon resistor structure for use within integrated circuits is described along with its method of fabrication. To form the polysilicon resistor structure of the present invention, a polysilicon resistor is first formed upon the surface of a semiconductor substrate. A pair of dummy polysilicon layers is formed along opposite edges of the polysilicon resistor, each one of the pair of dummy polysilicon layers being separated from the polysilicon resistor. A pair of metal sidewalls is then formed upon the upper surfaces of the pair of dummy polysilicon layers. A top metal layer is then formed bridging the upper surfaces of the pair of metal sidewalls. The pair of dummy polysilicon layers, the pair of metal sidewalls and the top metal layer form an open ended structure upon the semiconductor substrate within which structure the polysilicon resistor resides. The polysilicon resistor is separated from the structure by an insulating material which is not susceptible to outgassing of hydrogen.

In a first embodiment of the present invention, the pair of metal sidewalls is formed from a pair of successively stacked metal layers comprising a pair of first conductive contact studs, upon whose upper surfaces are formed a pair of patterned first metal layers, upon whose upper surfaces in turn are formed a pair of second conductive contact studs. The pair of first conductive contact studs make contact with the pair of dummy polysilicon layers and the pair of second conductive contact studs make contact with the top metal layer. The top metal layer is formed from a patterned second metal layer within the integrated circuit within which the polysilicon resistor structure of the present invention is formed.

A second embodiment follows analogously from the first embodiment with the exception that the pair of first conductive contact studs and the pair of second conductive contact studs are eliminated when forming the pair of metal sidewalls. Instead, the pair of patterned first metal layers is formed to make contact with the pair of dummy polysilicon layers and the top metal layer is formed to make contact with the pair of patterned first metal layers. The top metal layer is still formed from a patterned second metal layer within the integrated circuit within which the polysilicon resistor structure of the present invention is formed.

The polysilicon resistor structure formed in accord with the present invention has a polysilicon resistor formed therein which has limited susceptibility to resistance changes due to absorption of hydrogen. The polysilicon resistor structure of the present invention provides a nearly complete structure which shields the polysilicon resistor within the polysilicon resistor structure from intrusion of hydrogen. In addition, the dummy polysilicon layers of the polysilicon resistor structure of the present invention provide a pair of structures which getter any hydrogen which might diffuse within the polysilicon resistor structure of the present invention.

The polysilicon resistor structure of the present invention is readily manufacturable. The polysilicon resistor structure of the present invention is formed from elements which are required for other structures within the integrated circuit into which is formed the polysilicon resistor structure of the present invention. For example, the pair of dummy polysilicon layers of the polysilicon resistor structure of the present invention may be formed simultaneously from the same polysilicon layer which is used to form the polysilicon resistor of the present invention. Similarly, the pair metal sidewalls and the top metal layer of the polysilicon resistor structure of the present invention may be formed in part from patterning a blanket first metal layer and a blanket second metal layer used to form other conductor structures within the integrated circuit within which is formed the polysilicon resistor structure of the present invention.

BRIEF DESCRIPTION OF THE DRAWINGS

The accompanying drawings, which form a material part of this disclosure, show the following.

DETAILED DESCRIPTION OF THE PREFERRED EMBODIMENTS

The present invention differs significantly from methods known in the art for shielding polysilicon resistors from intrusion of hydrogen. Whereas the prior art discloses the use of a metal plate above a polysilicon resistor in order to limit diffusion of hydrogen vertically to the resistor, the present invention provides a three dimensional structure of conductive layers surrounding three sides of a polysilicon resistor which are exposed upon a semiconductor surface. In addition, the present invention also provides dummy polysilicon layers which are part of the three dimensional polysilicon resistor structure within which resides the polysilicon resistor of the present invention. The dummy polysilicon layers serve as getters which absorb hydrogen intruding into the integrated circuit structure before the intruding hydrogen can reach the polysilicon resistor.

The polysilicon resistor structure of the present invention may be used in any integrated circuit where there is needed a polysilicon resistor of stable resistance which is not susceptible to absorption of hydrogen. The polysilicon resistor and polysilicon resistor structure formed through the method of the present invention may be formed within integrated circuits including but not limited to Dynamic Random Access Memory (DRAM) integrated circuits, Static Random Access Memory (SRAM) integrated circuits, bipolar transistor integrated circuits and field effect transistor integrated circuits.

Figure 1A:
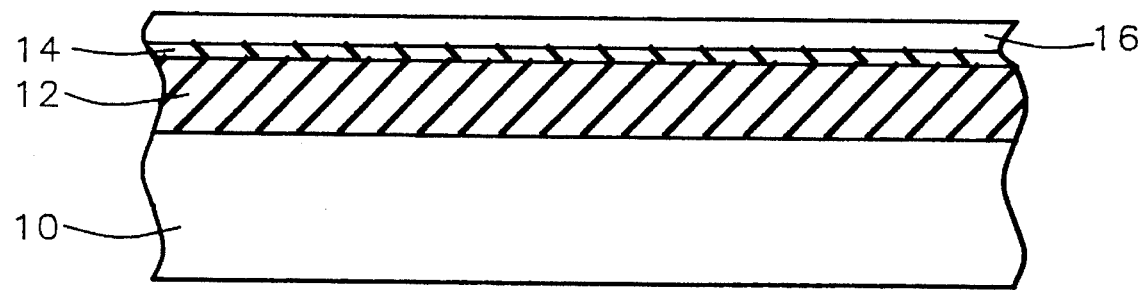
FIG. 1a to FIG. 1d show a series of schematic cross-sectional diagrams illustrating progressive stages in forming the polysilicon resistor structure of the first preferred embodiment of the present invention.
Figure 1B:
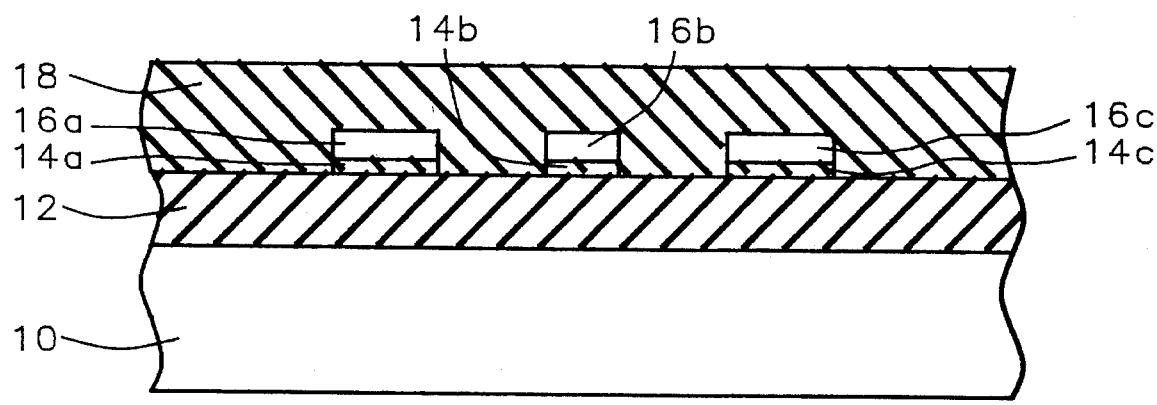
Figure 1C:
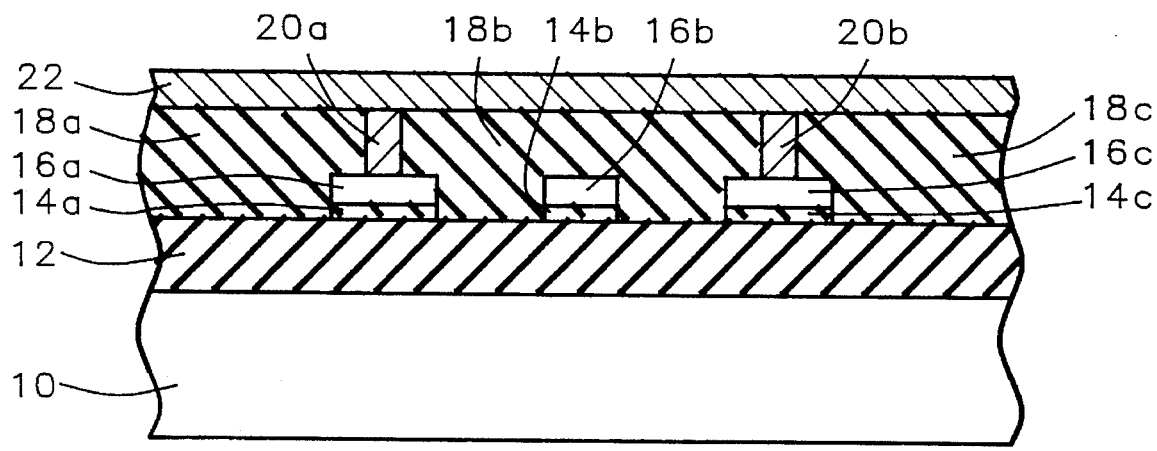
Figure 1D:
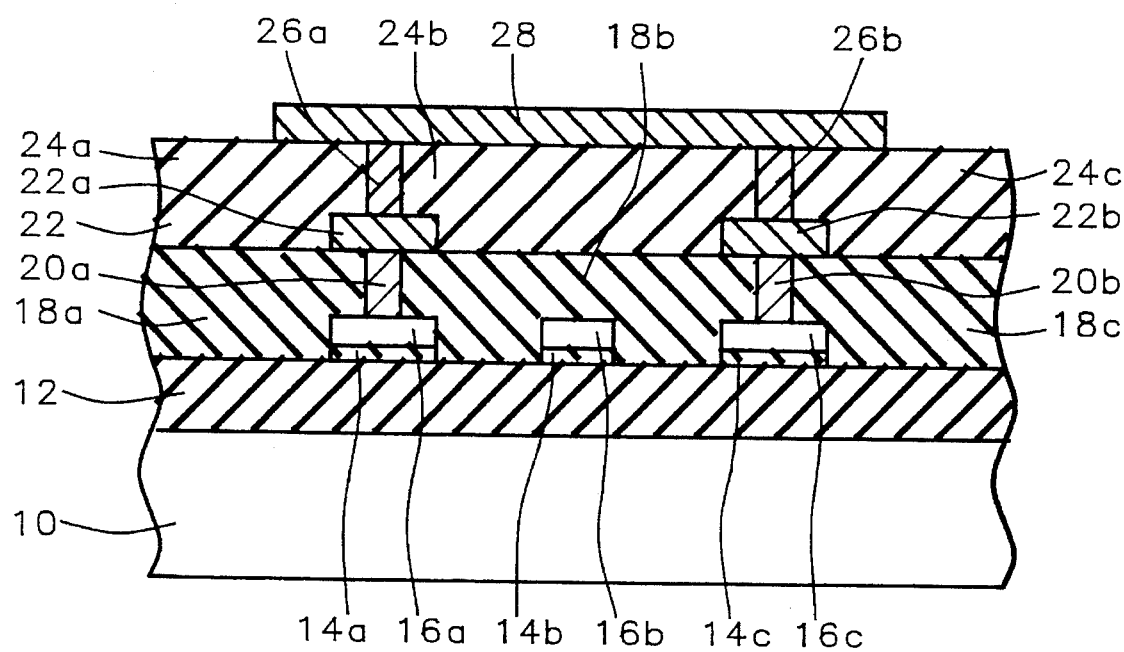

Referring now to FIG. 1a and FIG. 1d there is shown a series of cross-sectional schematic diagrams illustrating progressive process steps in forming the first preferred embodiment of the polysilicon resistor structure of the present invention. Shown in FIG. 1a is a cross-sectional schematic diagram which illustrates the first series of process steps in forming the polysilicon resistor structure of the first preferred embodiment of the present invention. Shown in FIG. 1a is a semiconductor substrate 10 having formed upon its surface a field oxide layer 12. Formed upon the field oxide layer 12 is a blanket inter-polysilicon oxide layer 14, and formed upon the blanket inter-polysilicon oxide layer 14 is a blanket polysilicon layer 16.

Although the present invention may be practiced upon semiconductor substrates of either dopant polarity, varying dopant concentrations and varying crystallographic orientations, the semiconductor substrate 10 upon which the present invention is practiced will typically be a silicon semiconductor substrate having a (100) crystallographic orientation and either a N- or P- polarity. Formed upon this semiconductor substrate 10 is a field oxide layer 12.

Methods by which field oxide layers may be formed upon semiconductor substrates are well known in the art. Such field oxide layers may be formed upon semiconductor substrates through methods including but not limited to thermal oxidation methods whereby the surface of a semiconductor substrate is oxidized to form a field oxide layer and oxide deposition methods whereby a field oxide layer is deposited upon the surface of a semiconductor substrate through oxidation of a suitable silicon oxide precursor material. For the preferred embodiments of the present invention, the field oxide layer 12 is preferably formed through a thermal oxidation method whereby the surface of the semiconductor substrate 10 is oxidized to form the field oxide layer 12. The thermal oxidation is preferably undertaken at about 980 to about 1000 degrees centigrade for a time period of about 250 to about 320 minutes. Upon completion of this thermal oxidation, a field oxide layer 12 of thickness of about 4000 to about 5000 angstroms is formed upon the surface of the semiconductor substrate 10.

Upon the field oxide layer 12 is next formed a blanket inter-polysilicon oxide layer 14. Similarly to other elements of the polysilicon resistor structure of the present invention, the blanket inter-polysilicon oxide layer 14 also has other applications within the integrated circuit within which the polysilicon resistor structure of the present invention is formed. The blanket inter-polysilicon oxide layer 14 is preferably formed from a silicon oxide material deposited upon the field oxide layer 12 through a Low Pressure Chemical Vapor Deposition (LPCVD) process employing Tetra Ethyl Ortho Silicate (TEOS) as the silicon source material at a temperature of about 700 to about 800 degrees centigrade. Through this process, a blanket inter-polysilicon oxide layer 14 of thickness of about 400 to about 700 angstroms may be formed upon the field oxide layer 12.

Upon the blanket inter-polysilicon oxide layer 14 is formed a blanket polysilicon layer 16. There are several methods and materials through which blanket polysilicon layers may be formed upon semiconductor substrates. Such methods include but are not limited to Physical Vapor Deposition (PVD) sputtering methods and Chemical Vapor Deposition (CVD) methods. The CVD methods may use as silicon source gases from which is formed a blanket polysilicon layer silane, disilane and silicon chloride. For the preferred embodiments of the present invention, the blanket polysilicon layer 16 is preferably formed through a Chemical Vapor Deposition (CVD) method employing silane as the silicon source gas. Through this method a blanket polysilicon layer 16 of thickness of about 2400 to about 3000 angstroms is formed upon the surface of the blanket inter-polysilicon oxide layer 14.

Although it is not required for the present invention, it is possible to dope the blanket polysilicon layer 16 with dopant species which modify the conductivity of that layer. Such doping may be accomplished through co-deposition of dopant species with the silicon source gas from which is formed the blanket polysilicon layer 16. Alternatively, the blanket polysilicon layer 16 once formed may be diffused with dopant species at sufficient concentration, or implanted with dopant species at a sufficient ion implantation dose and ion implantation energy, to yield the desired level of conductivity to the blanket polysilicon layer 16. Dopant species which may typically be employed to provide the desired level of conductivity to the blanket polysilicon layer 16 include but are not limited to arsenic dopant species, boron dopant species and phosphorus dopant species.

Referring now to FIG. 1b there is shown a schematic cross-sectional diagram which illustrates the next series of process steps in forming the polysilicon resistor structure of the first preferred embodiment of the present invention. Shown in FIG. 1b is the patterning of the blanket polysilicon layer 16 to form the resistive polysilicon layers 16a and 16c, and the polysilicon resistor 16b. Also shown in FIG. 1b is the patterning of the blanket inter-polysilicon oxide layer 14 to form the patterned inter-polysilicon oxide layers 14a, 14b and 14c.

The patterning of the blanket polysilicon layer 16 and the blanket inter-polysilicon oxide layer 14 may be accomplished through several methods as are known in the art. Such methods typically utilize an appropriately patterned photoresist etch mask and include but are not limited to wet chemical etch methods and dry plasma etch methods such as Reactive Ion Etch (RIE) methods and Magnetically Enhanced Reactive Ion Etch (MERIE) methods. For the preferred embodiments of the present invention, it is preferred that the blanket polysilicon layer 16 and the blanket inter-polysilicon oxide 14 layer be patterned through successive etch removal processes of portions of those layers exposed through an appropriate photoresist etch mask. The photomasked blanket polysilicon layer 16 is first etched through a dry plasma Reactive Ion Etch (RIE) process until the exposed portions of that layer have been completely etched. Subsequently, portions of the blanket inter-polysilicon oxide layer 14 exposed through the same photoresist etch mask are etched with a 50:1 dilute hydrofluoric acid solution until the exposed portions of that layer are completely removed. When etching the blanket inter-polysilicon oxide layer 14 in this fashion an over-etching into the field oxide layer 12 by about 100 angstroms is common.

Also shown in FIG. 1b is a blanket inter-level dielectric layer 18 which is formed over the surface of the semiconductor substrate 10 after the blanket polysilicon layer 16 and the blanket inter-polysilicon oxide layer 14 have been patterned. Blanket inter-level dielectric layers may be formed through several methods and materials as are known in the art. Materials from which blanket inter-level dielectric layers may be formed include but are not limited to glasses, oxide materials and nitride materials. Methods by which these materials may be formed upon semiconductor substrate surfaces include but are not limited to Chemical Vapor Deposition (CVD) methods, Plasma Enhanced Chemical Vapor Deposition (PECVD) methods and Physical Vapor Deposition (PVD) sputtering methods.

For the first preferred embodiment of the present invention the blanket inter-level dielectric layer 18 is preferably formed by first planarizing the surface of the semiconductor substrate 10 through use of a spin-on-glass composition followed by an appropriate etch back process. Upon the planarized surface is then formed a Boro Phospho Silicate Glass (BPSG) layer derived from Tetra Ethyl Ortho Silicate (TEOS) as the silicon source material co-deposited with suitable boron and phosphorus dopant species. The TEOS derived BPSG layer is formed through a Chemical Vapor Deposition (CVD) process. Together, the spin-on-glass layer and the TEOS derived BPSG layer form a blanket inter-level dielectric layer 18 of thickness of about 8000 to about 10000 angstroms respect to the field oxide layer 12. It is critical to the present invention that the components of the blanket inter-level dielectric layer 18 not be susceptible to outgassing of hydrogen. The materials which are employed in forming the blanket inter-level dielectric layer 18 within the first preferred embodiment of the present invention fulfill this requirement.

Referring now to FIG. 1c there is shown a schematic cross-sectional diagram illustrating the next series of process steps in accord with the first preferred embodiment of the present invention. Shown in FIG. 1c is the patterning of the blanket inter-level dielectric layer 18 of FIG. 1b to yield the patterned inter-level dielectric layers 18a, 18b and 18c. Several methods may be employed in patterning the blanket inter-level dielectric layer 18, including but not limited to wet chemical and dry plasma etching of portions of the blanket inter-level dielectric layer 18 exposed through a suitable photoresist etch mask. For the first preferred embodiment of the present invention, it is preferred that the blanket inter-level dielectric layer 18 be patterned to form the patterned inter-level dielectric layers 18a, 18b and 18c through a Reactive Ion Etch (RIE) plasma etch removal of portions of the blanket interlevel dielectric layer 18 exposed through an appropriate photoresist etch mask. The RIE plasma etch process preferably employs carbon tetra-fluoride and tri-fluoro methane as etch gasses. The etching of the blanket inter-level dielectric layer 18 is undertaken for a time sufficient to expose the upper surfaces of the pair of resistive polysilicon layers 16a and 16c.

Subsequent to patterning of the blanket inter-level dielectric layer 18, a pair of first conductive contact studs 20a and 20b is formed into the vias between the patterned inter-level dielectric layers 18a and 18b, and the patterned inter-level dielectric layers 18b and 18c, respectively. The pair of conductive contact studs 20a and 20b make contact with the corresponding surfaces of the resistive polysilicon layers 16a and 16c.

Methods and materials through which conductive contact studs may be formed upon semiconductor substrates are known in the art. Conductive contact studs are typically formed from a multi-layer metallization structure which includes a thick conductor metallization layer below and/or above which reside thinner metallization layers. The thinner metallization layers provide characteristics to the multi-layer metallization structure including but not limited to barrier characteristics, adhesive characteristics, abrasion resistance characteristics and anti-reflection characteristics. Conductor metallization layers within multi-layer metallization structures are typically formed from materials including but not limited to highly doped polysilicon, tungsten, copper, aluminum and aluminum alloys. Thinner metallization layers within the multi-layer metallization structures are typically formed from materials including but not limited to metal nitrides, metal silicides, nobel metals and refractory metals chosen in accord with the property desired for the thinner metallization layer to impart to the multi-layer metallization structure. All of the metallization layers within the multi-layer metallization structure may typically be formed through methods conventional to the art. These methods include Physical Vapor Deposition (PVD) sputtering methods, evaporation methods and Chemical Vapor Deposition (CVD) methods as appropriate to the composition of the metallization layer to be formed within the multi-layer metallization structure.

For the first preferred embodiment of the present invention, the conductive contact studs 20a and 20b are preferably formed from a three component multi-layer metallization structure. The first component within the multi-layer metallization structure is preferably a thin titanium metallization layer of about 300 to about 500 angstroms thickness. The thin titanium metallization layer reduces the contact resistance of conductive substrates upon which the conductive contact studs 20a and 20b are formed. Upon the thin titanium metallization layer is formed a thin titanium nitride metallization layer of about 800 to about 1200 angstroms. The thin titanium nitride metallization layer improves the adhesive and barrier properties of the conductive contact studs 20a and 20b. Finally, there is formed upon the thin titanium nitride metallization layer a thick conductor metallization layer formed from tungsten deposited through a Chemical Vapor Deposition (CVD) process. The thick tungsten conductor metallization layer is formed to a thickness sufficient to reach the upper surfaces of the patterned inter-level dielectric layers 18a, 18b and 18c. Any excess quantities of metallization layers within the multi-layer metallization structure which have formed upon the surface of the patterned inter-level dielectric layers 18a, 18b and 18c may be removed through etching methods and polishing methods as are conventional in the art.

Subsequent to forming the first conductive contact studs 20a and 20b, a blanket first metal layer 22 is formed upon the surface of the semiconductor substrate 10. Methods and materials through which blanket metal layers may be formed upon semiconductor substrates are known in the art. Analogously to conductive contact studs, blanket metal layers are often formed of multi-layer metallization structures comprising a thick conductor metallization layer above and/or below which reside thinner metallization layer(s). The thinner metallization layers provide characteristics to the multi-layer metallization structure including but not limited to barrier characteristics, adhesive characteristics, abrasion resistance characteristics and anti-reflective characteristics. Methods through which conductor metallization layers and thinner metallization layers within multi-layer metallization structures may be formed upon semiconductor substrates include but are not limited to thermal evaporation methods, electron beam assisted evaporation methods and Physical Vapor Deposition (PVD) sputtering methods. Materials from which conductor metallization layers within blanket metal layers may be formed upon semiconductor substrates include but are not limited to aluminum, aluminum alloys and copper. Materials from which thinner metallization layers may be formed within blanket metallization layers include but are not limited to metal nitrides, metal silicides, refractory metals and nobel metals.

For the first preferred embodiment of the present invention, the blanket first metal layer 22 is preferably formed from a two component multi-layer metallization structure comprising a thinner titanium nitride metallization layer of about 800 to about 1200 angstroms thickness upon which is formed a thick conductor metallization layer formed from a copper containing aluminum alloy layer of thickness about 4000 to about 6000 angstroms.

Referring now to FIG. 1d there is shown a schematic cross-sectional diagram which illustrates the last series of process steps in forming the polysilicon resistor structure of the first preferred embodiment of the present invention. Shown in FIG. 1d are patterned first metal layers 22a and 22b. The patterned first metal layers 22a and 22b are formed by patterning of the blanket first metal layer 22. Methods for patterning metal layers within integrated circuits are known in the art. Typically, such methods involve etching of portions of those metal layers exposed through a suitable photoresist etch mask. The etching may be accomplished by means of a reactive plasma method or wet chemical etch method appropriate to the metal layer being etched. For the first preferred embodiment of the present invention portions of the copper containing aluminum alloy metallization layer and titanium nitride metallization layer from which the blanket first metal layer 22 is formed are preferably etched through exposure to a chlorine containing Reactive Ion Etch (RIE) plasma etch process to form the patterned first metal layers 22a and 22b.

Upon the patterned first metal layers 22a and 22b is then formed a blanket inter-metallic dielectric layer which is patterned to form patterned inter-metallic dielectric layers 24a, 24b and 24c. The methods and materials by which the patterned inter-metallic dielectric layers 24a, 24b and 24c are formed and patterned from the blanket inter-metallic dielectric layer are analogous to the methods and materials by which patterned inter-level dielectric layers 18a, 18b and 18c are patterned and formed from the blanket inter-level dielectric layer 18. Specifically, the blanket inter-metallic dielectric layer is preferably formed from a multi-layer oxide structure which includes a planarization process involving a spin-on-glass composition. Analogously to the blanket inter-level dielectric layer 18, it is also critical to the present invention that the blanket inter-metallic dielectric layer from which are formed the patterned inter-metallic dielectric layers 24a, 24b and 24c also not be formed from component materials which are susceptible to outgassing of hydrogen. The blanket inter-metallic dielectric layer is patterned to yield patterned inter-metallic dielectric layers 24a, 24b and 24c preferably through a Reactive Ion Etch (RIE) process employing carbon tetrafluoride and tri-fluoro methane as the etchant gasses. The vias between patterned inter-metallic dielectric layers 24a and 24b and patterned inter-metallic dielectric layers 24b and 24c are etched sufficiently to reach the surfaces of first metal layers 22a and 22b, respectively. Overall, the thickness of the patterned inter-metallic dielectric layers 24a, 24b and 24c are about 8000 to about 14000 angstroms each as measured from the respective surfaces of the patterned inter-level dielectric layers 18a, 18b and 18c.

Formed into the vias between patterned inter-metallic dielectric layers 24a and 24b and patterned inter-metallic dielectric layers 24b and 24c, respectively is a pair of second conductive contact studs 26a and 26b. The pair of second conductive contact studs may typically be formed from the same group of materials from which the pair of first conductive contact studs 20a and 20b is formed. Analogously to the fashion by which the pair of first conductive contact studs 20a and 20b is formed, the pair of second conductive contact studs 26a and 26b is also preferably formed from a multi-layer metallization structure which contains similar metallization layers and thicknesses. Specifically, the pair of second conductive contact studs 26a and 26b is preferably formed from a thin metallization layer formed from titanium nitride at a thickness of about 800 to about 1200 angstroms, above which thin titanium nitride metallization layer resides a thick conductor metallization layer. The thick conductor metallization layer is formed of tungsten metal deposited through a Chemical Vapor Deposition (CVD) process. The thick tungsten conductor metallization layer is of sufficient thickness to reach the upper surfaces of the patterned inter-metallic dielectric layers 24a, 24b and 24c.

Finally, a patterned second metal layer 28 is formed upon the surfaces of the patterned inter-metallic dielectric layers 24a, 24b and 24c. The patterned second metal layer 28 makes contact and bridges the pair of second conductive contact studs 26a and 26b. The patterned second metal layer 28 is preferably formed through methods and materials similar to the methods and materials which are used to form and pattern the blanket first metal layer 22 into the patterned first metal layers 22a and 22b. Specifically, the patterned second metal layer 28 is formed through patterning a blanket second metal layer formed upon the semiconductor substrate 10. The blanket second metal layer is preferably formed from a multi-layer metallization structure comprised of a thin titanium nitride metallization layer of about 800 to about 1200 angstroms thickness formed beneath a thick copper containing aluminum alloy conductor metallization layer. The thick copper containing aluminum alloy conductor metallization layer is formed at a thickness of about 4000 to about 6000 angstroms.

Upon patterning the blanket second metal layer there is formed the polysilicon resistor structure of the first preferred embodiment of the present invention. The polysilicon resistor 16b which resides within the polysilicon resistor structure of the first preferred embodiment of the present invention has limited susceptibility to resistance changes due to absorption of hydrogen. The polysilicon resistor structure of the present invention effectively shields the polysilicon resistor 16b residing therein from infiltration of hydrogen. In addition, the resistive polysilicon layers 16a and 16c getter any hydrogen which might form within the polysilicon resistor structure of the first preferred embodiment of the present invention.

Figure 2:
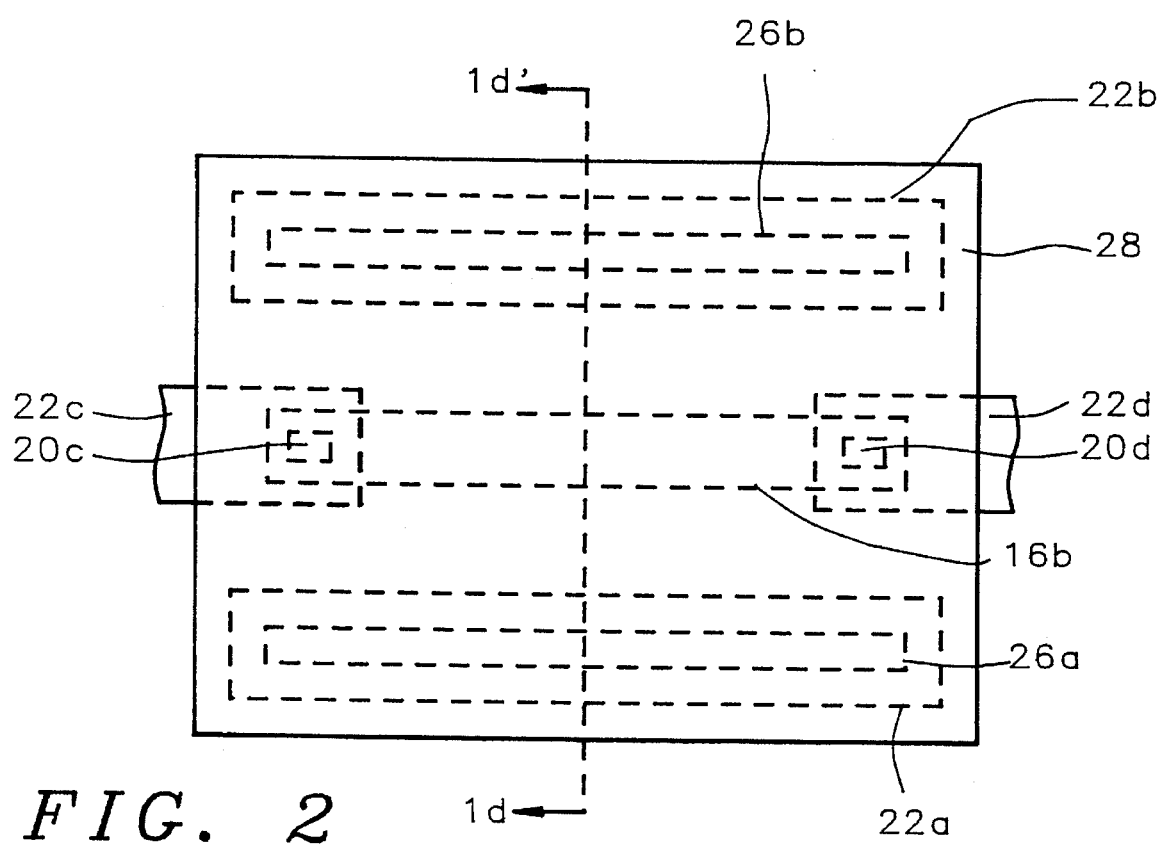
FIG. 2 shows a plan-view schematic diagram corresponding to FIG. 1d.

Shown in FIG. 2 is a plan-view schematic diagram of the polysilicon resistor structure which corresponds to the cross-sectional schematic diagram of FIG. 1d. Shown in FIG. 2 is the top surface of the patterned second metal layer 28.

Beneath the patterned second metal layer 28 are shown the perimeters of the second conductive contact studs 26a and 26b. Coincident with the perimeters of the second conductive contact studs 26a and 26b are the perimeters of the first conductive contact studs 20a and 20b, respectively. Also shown in FIG. 1d are the perimeters of the patterned first metal layers 22a and 22b. Coincident with the perimeter of the patterned first metal layer 22a are the perimeters of the resistive polysilicon layer 16a and the patterned inter-polysilicon oxide layer 14a. Coincident with the perimeter of the patterned first metal layer 22b are the perimeters of the resistive polysilicon layer 16c and the patterned inter-polysilicon oxide layer 14c. There is also shown the perimeter of the polysilicon resistor 16b which corresponds with the perimeter of the patterned inter-polysilicon oxide layer 14b. Finally there is also shown in FIG. 2 the patterned first metal layers 22c and 22d which are connected to opposite ends of the polysilicon resistor 16b through first conductive contact studs 20c and 20d, respectively.

As is clear from the description of the first preferred embodiment of the present invention, the structure upon the semiconductor substrate 10 within which structure resides the polysilicon resistor 16b of the present invention may be formed from metal layers and conductive contact studs above the patterned second metal layer 28 and the pair of second conductive contact studs 26a and 26b of the present invention. The structure upon the semiconductor substrate 10 within which structure resides the polysilicon resistor 16b of the present invention may be formed from metal layers and conductive contact studs including the uppermost metal layers and uppermost conductive contact studs within the integrated circuit within which the polysilicon resistor structure of the present invention is formed.

In addition to the first preferred embodiment of the present invention, there also exists a second preferred embodiment of the present invention. The second preferred embodiment differs from the first preferred embodiment in that the polysilicon resistor structure of the second preferred embodiment does not employ the pair of first conductive contact studs 20a and 20b to make contact between the pair of resistive polysilicon layers 16a and 16c and the pair of patterned first metal layers 22a and 22b, respectively. Nor does the second preferred embodiment employ a pair of second conductive contact studs 26a and 26b to make contact between the pair of patterned first metal layers 22a and 22b and the patterned second metal layer 28.

Figure 3:
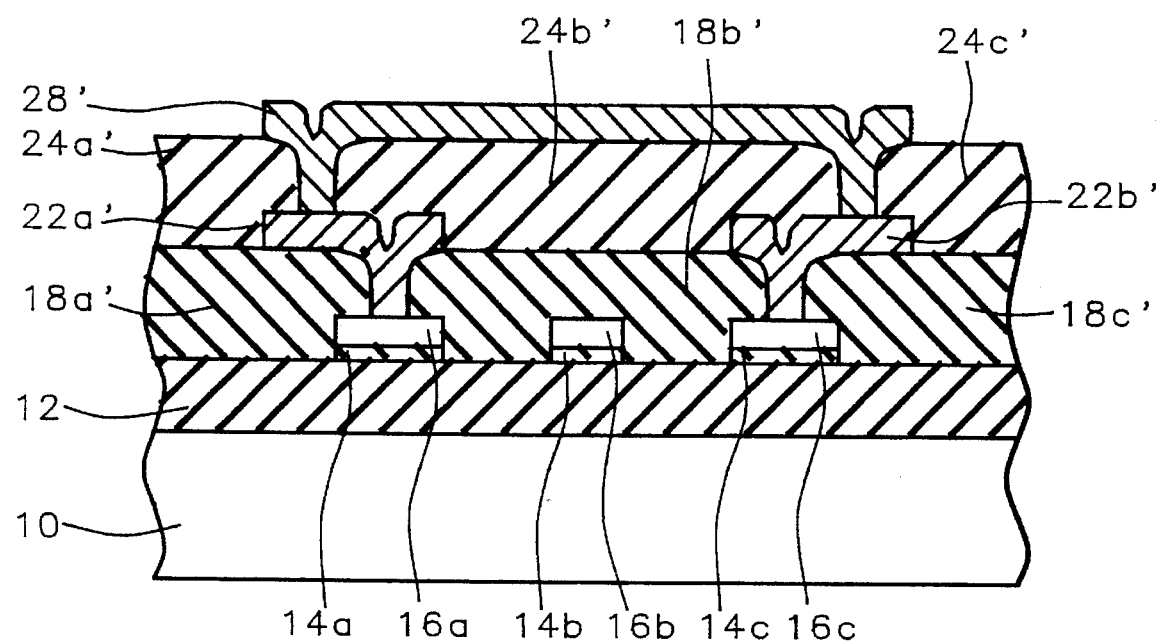
FIG. 3 shows a schematic cross-sectional diagram illustrating the second preferred embodiment of the present invention.

Rather, within the second preferred embodiment as shown in FIG. 3, the patterned first metal layers 22a' and 22b' are formed into the vias between the patterned inter-level dielectric layers 18a' and 18b' and the patterned inter-level dielectric layers 18b' and 18c', respectively, to make contact with resistive polysilicon layers 16a and 16c, respectively. Similarly, the patterned second metal layer 28' is formed into the vias between patterned inter-metallic dielectric layers 24a' and 24b', and patterned inter-metallic dielectric layers 24b' and 24c' to make contact with the patterned first metal layers 22a' and 22b', respectively.

The second preferred embodiment may, in general, be formed through processes which are analogous to the processes employed in forming the polysilicon resistor structure of the first preferred embodiment of the present invention. The width and contours of via openings between dielectric layers may need to be adjusted to ensure sufficient filling of metal layers into those via openings.

As is understood by a person skilled in the art, the preferred embodiments of the present invention are intended as illustrative of embodiments of the present invention rather than limiting of embodiments of the present invention. Various changes may be made to methods and materials through which are formed the preferred embodiments of the present invention while still providing an embodiment within the spirit and scope of the present invention.

What is claimed is:

1. A method for forming a polysilicon resistor structure within an hydrogen annealed integrated circuit comprising:

forming a polysilicon resistor upon the surface of a semiconductor substrate;

forming a pair of hydrogen gettering dummy polysilicon layers along opposite edges of the polysilicon resistor, each one of the pair of dummy polysilicon layers being separated from the polysilicon resistor;

forming a pair of metal sidewalls upon the upper surfaces of the pair of dummy polysilicon layers; and forming a top metal layer bridging the upper surfaces of the pair of metal sidewalls, the pair of dummy polysilicon layers, the pair of metal sidewalls and the top metal layer forming an open ended structure upon the semiconductor substrate within which structure the polysilicon resistor resides, the polysilicon resistor being separated from the structure by an insulating material which is not susceptible to outgassing of hydrogen.

2. The method of claim 1 wherein the thicknesses of the polysilicon resistor and the dummy polysilicon layers are about 2400 to about 3000 angstroms each.

3. The method of claim 1 wherein the pair of metal sidewalls is formed from a pair of successively stacked metal layers comprising a pair of first conductive contact studs, upon whose upper surfaces are formed a pair of patterned first metal layers, upon whose upper surfaces in turn are formed a pair of second conductive contact studs.

4. The method of claim 3 wherein the pair of first conductive contact studs and the pair of second conductive contact studs are formed at least in part from a material chosen from the group of materials consisting of highly doped polysilicon, tungsten, copper, aluminum and aluminum containing alloys.

5. The method of claim 4 wherein the pair of first conductive contact studs and the pair of second conductive contact studs are formed at least in part from tungsten.

6. The method of claim 3 wherein the pair of first metal layers is formed at least in part from a metal chosen from the group of metals consisting of aluminum, aluminum alloys and copper.

7. The method of claim 6 wherein the pair of first metal layers is formed at least in part from a copper containing aluminum alloy.

8. The method of claim 1 wherein the top metal layer is formed from a patterned second metal layer within an integrated circuit.

9. The method of claim 8 wherein the patterned second metal layer is formed at least in part from a copper containing aluminum alloy.

10. The method of claim 1 wherein the insulating material is formed from an inter-level dielectric layer of thickness of about 8000 to about 10000 angstroms upon which is formed an inter-metallic dielectric layer of thickness of about 8000 to about 14000 angstroms.

11. The method of claim 1 further comprising forming an inter-polysilicon oxide layer beneath the polysilicon resistor.

12. The method of claim 11 wherein the inter-polysilicon oxide layer is formed from a silicon oxide deposited through a Low Pressure Chemical Vapor Deposition (LPCVD) process at a thickness of about 400 to about 700 angstroms.

13. The method of claim 1 further comprising doping the polysilicon resistor.

14. The method of claim 13 wherein the polysilicon resistor is doped with a dopant species chosen from the group of dopant species consisting of arsenic dopant species, boron dopant species and phosphorus dopant species.

15. A method for forming a polysilicon resistor structure within an hydrogen annealed integrated circuit comprising:

forming a polysilicon resistor upon the surface of a semiconductor substrate;

forming a pair of dummy hydrogen gettering polysilicon layers along opposite edges of the polysilicon resistor, each one of the pair of dummy polysilicon layers being separated from the polysilicon resistor;

forming a pair of patterned first metal layers upon the pair of upper surfaces of the pair of dummy polysilicon layers; and forming a patterned second metal layer bridging the upper surfaces of the pair of patterned first metal layers, the pair of dummy polysilicon layers, the pair of patterned first metal layers and the patterned second metal layer forming an open ended structure upon the semiconductor substrate within which structure the polysilicon resistor resides, the polysilicon resistor being separated from the structure by an insulating material which is not susceptible to outgassing of hydrogen.

16. A polysilicon resistor structure formed with an hydrogen annealed integrated circuit comprising:

a polysilicon resistor formed upon the surface of a semiconductor substrate;

a pair of hydrogen gettering dummy polysilicon layers formed along opposite edges of the polysilicon resistor, each one of the pair of dummy polysilicon layers being separated from the polysilicon resistor;

a pair of metal sidewalls formed upon the pair of upper surfaces of the pair of dummy polysilicon layers;

a top metal layer formed bridging the upper surfaces of the pair of metal sidewalls, the pair of dummy polysilicon layers, the pair of metal sidewalls and the top metal layer forming an open ended structure upon the semiconductor substrate within which structure the polysilicon resistor resides; and an insulating material separating the polysilicon resistor from the structure, the insulating material being not susceptible to outgassing of hydrogen.

17. The polysilicon resistor structure of claim 16 wherein the thicknesses of the polysilicon resistor and the dummy polysilicon layers are from about 2400 to about 3000 angstroms each.

18. The polysilicon resistor structure of claim 16 wherein the pair of metal sidewalls is formed from a pair of successively stacked metal layers comprising a pair of first conductive contact studs, upon whose upper surfaces are formed a pair of patterned first metal layers, upon whose upper surfaces in turn are formed a pair of second conductive contact studs.

19. The polysilicon resistor structure of claim 16 wherein the top metal layer is formed from a patterned second metal layer within an integrated circuit.

20. The polysilicon resistor structure of claim 16 wherein the insulating material is formed from an inter-level dielectric layer of thickness of about 8000 to about 10000 angstroms upon which is formed an inter-metallic dielectric layer of thickness of about 8000 to about 14000 angstroms.

21. The polysilicon resistor structure of claim 16 further comprising an inter-polysilicon oxide layer formed beneath the polysilicon resistor, the inter-polysilicon oxide layer being formed from a silicon oxide material deposited through a Low Pressure Chemical Vapor Deposition (LPCVD) process at a thickness of about 400 to about 700 angstroms.

22. The polysilicon resistor structure of claim 16 further comprising a doping of the polysilicon resistor with dopant species chosen from the group of dopant species consisting of arsenic dopant species, phosphorus dopant species and boron dopant species.

* * * * *